United States Patent [19]

Weeks

[11] Patent Number: 5,763,122
[45] Date of Patent: Jun. 9, 1998

[54] LOW OPTICAL DOT GAIN COLOR PROOF COMPOSITES

[75] Inventor: Bruce W. Weeks, Lake Elmo, Minn.

[73] Assignee: Imation Corp., Oakdale, Minn.

[21] Appl. No.: 787,514

[22] Filed: Jan. 21, 1997

Related U.S. Application Data

[63] Continuation of Ser. No. 550,891, Oct. 31, 1995, abandoned.

[51] Int. Cl.$^6$ ............................................. G03C 3/00
[52] U.S. Cl. ........................... 430/15; 430/257; 430/260; 430/293
[58] Field of Search ........................ 430/14, 15, 257, 430/260, 293

[56] References Cited

U.S. PATENT DOCUMENTS

| | | | |
|---|---|---|---|
| 3,060,024 | 10/1962 | Metuchen et al. | 96/28 |
| 3,136,637 | 6/1964 | Larson | 96/75 |
| 3,634,087 | 1/1972 | Houle et al. | 96/49 |
| 3,671,236 | 6/1972 | Van Beusekom | 96/15 |
| 4,304,836 | 12/1981 | Cheema et al. | 430/252 |
| 4,482,625 | 11/1984 | Namiki et al. | 430/143 |
| 4,596,757 | 6/1986 | Barton et al. | 430/257 |
| 4,634,652 | 1/1987 | Barton | 430/156 |
| 4,650,738 | 3/1987 | Platzer et al. | 430/143 |
| 4,656,114 | 4/1987 | Cederberg et al. | 430/160 |
| 4,719,169 | 1/1988 | Platzer et al. | 430/258 |
| 4,748,101 | 5/1988 | Barton | 430/160 |
| 4,751,166 | 6/1988 | Platzer et al. | 430/160 |
| 4,808,508 | 2/1989 | Platzer | 430/143 |
| 4,889,787 | 12/1989 | Musser | 430/166 |
| 4,929,532 | 5/1990 | Dunder | 430/143 |
| 4,952,482 | 8/1990 | Barton et al. | 430/325 |
| 4,999,266 | 3/1991 | Platzer et al. | 430/14 |
| 5,008,174 | 4/1991 | Platzer | 430/143 |
| 5,176,973 | 1/1993 | Gifford et al. | 430/15 |
| 5,192,630 | 3/1993 | Platzer | 430/14 |
| 5,248,583 | 9/1993 | Lundquist et al. | 430/263 |
| 5,258,261 | 11/1993 | Heller | 430/273 |
| 5,294,515 | 3/1994 | Wojciech et al. | 430/253 |

FOREIGN PATENT DOCUMENTS

| | | |
|---|---|---|
| 365356 | 10/1989 | European Pat. Off. |
| 365357 | 10/1989 | European Pat. Off. |
| 3336431 | 1/1991 | Germany |

*Primary Examiner*—John S. Chu
*Attorney, Agent, or Firm*—Arlene K. Musser

[57] ABSTRACT

As adhesive films are used over first down half-tone images, air can be entrapped between the dots on the first down image and the after applied adhesive film (e.g., with the next down image layer). The presence of the air as bubbles between the dots creates additional areas of reflection and refraction at air/film interfaces. The use of thin layers of adhesive with the properties according to the present invention has surprisingly been found to prevent or reduce formation of bubbles and thereby maintain the critical optical properties necessary in a proofing material.

8 Claims, No Drawings

LOW OPTICAL DOT GAIN COLOR PROOF COMPOSITES

This is a continuation of application No. 08/550,891 filed 10/31/95.

FIELD OF THE INVENTION

This invention relates to aqueous developable presensitized color proofing elements. In particular, this invention relates to color proofing elements containing transparent thin adhesive layers used in the construction of color proof composites having improved lamination quality and lower optical dot gain.

DISCUSSION OF THE ART

In color reproduction, the color accuracy of graphic art color separation negatives are generally verified using color proofing systems prior to making the corresponding printing plates. The color proofing systems must provide a consistent representation of the final color print. It is well known in the art that halftone dot gain plays a significant role in the color rendition of the final image. Dot gain is made up of both physical and optical effects; where a physical gain is an actual physical change in the size of the dot and optical gain is an optical enhancement due to internal reflections within the composite surrounding the halftone dot. Slight changes in the dot reproduction curve due to physical and optical dot gains can cause significant changes in visual color perception. Therefore, when using a color proofing system one must take into account the percent dot growth due to both physical and optical effects to achieve a reasonable match to the color press sheet.

Several different types of color proofing systems are well known in the literature. Both digital and conventional proofing systems are available commercially. In digital systems, digitized data is used to directly image the color proofing materials. However, conventional proofing systems are primarily used when verifying the color accuracy of graphic art color separation films. Conventional color proofing systems consist of two types: overlay and surprint.

Overlay systems provide a convenient and quick way to visualize a representative color on a transparent substrate. A typical overlay film construction includes a polyester substrate and photosensitive color layer. Optional protective layers may also be included over the surface of the photosensitive color layer. A color proof is constructed by individually imaging and developing each representative color proofing film. The color imaged films are then laid upon each other in register on a paper stock. Even though this method provides a very simple way of combining two or more colors in registration, it has several inherent disadvantages. The multiplicity of plastic sheets causes incident light to internally reflect which imparts a gloss, color hue shift, optical dot gain and a distortion of the final image. Antireflection coatings improve the visual perception of the proof; however, the presence of the thick polyester between each colored image still causes visual distortion and very high optical dot gain of the final image. Examples of these types of constructions may be generally found in U.S. Pat. Nos. 3,136,637; 4,304,836; 4,482,625; 4,634,652; 4,748,101; 4,952,482; and 5,258,261.

A surprint proof is generated by successively superimposing different colored layers upon each other on a single sheet. The surprint color proofing materials are composed of two primary types: photosensitive precolored sheets and photosensitive colorless sheets whose latent image may be toned with pigments, inks or dyes. Some examples of post-colored proofing materials may be found in U.S. Pat. Nos. 3,060,024; 3,634,087; and DE 3,336,431. The tackified image is generally weak and often requires a protective layer. In addition, the resultant color hue is very user dependent due to the dependency upon color density control, lot to lot variation of the colorants and dusting of the toners causing color contamination. The electrostatic systems require more sophisticated equipment and environmental control which can be very expensive.

An example of a precolored proofing system includes photosensitive constructions that are imaged prior to lamination to the receptor or intermediate sheet, typically refered to as lamination-in-register systems. Representative examples of these types of systems are described in U.S. Pat. Nos. 4,482,625 and 4,304,836. These systems require the imaged films to be laminated in register which is dependent upon laminating speed and temperature, and dimensional stability of the film and receptor. The accuracy of the registration is limited to smaller format proofs due to the difficulty in retaining perfect alignment of images during the thermal lamination process. Even though a relatively thick soft receiving layer is used to encapsulate the image, if the lamination conditions are not chosen carefully, air is entrapped between the image and the receiving layer which leads to image distortion.

Another type of pre-colored proofing system includes presensitized colored sheets which are laminated, exposed and developed sequentially. This process does not require lamination-in-register, since the photosensitive films are exposed after lamination to the composite. An example of this type of color proofing system is described in U.S. Pat. No. 3,671,236, which uses a negative acting presensitized color proofing element comprising a carrier sheet having a smooth release surface, a diazo sensitized color layer and a non-photoactive barrier layer upon which may be coated a pressure sensitive adhesive. U.S. Pat. No. 4,656,114 describes a modification of this photosensitive element where the pressure sensitive adhesive is replaced with a thermally activated adhesive. The developing media for this system is a 50:50 mixture of n-propanol and water. The barrier layer is present as a carrier for the image and to reduce interaction between the adhesive and the photoactive layer. U.S. Pat. Nos. 4,650,738; 4,751,166; 4,808,508; 4,929,532; and 5,008,174; EP 365,356 and EP 365,357 patent applications describe improvements on this construction by eliminating the need for a barrier layer between the diazo based photoactive layer and the adhesive. U.S. Pat. Nos. 4,596,757 and 5,248,583 disclose further improvements on the construction described in U.S.

Patent No. 3,671,236 by utilizing a photopolymer system in place of the diazonium binders. A color proof composite is constructed by sequentially laminating, exposing and developing an image on a developer resistant substrate.

This process is repeated with different colored proofing elements until all the desired colored images are formed on the substrate. The image formed is a relief image located on the top surface of the composite after development. In building a multicolored proof the relief images formed are encapsulated by the adhesive layer of the color proofing element laminated next in the process. The adhesive layer not only provides a protective layer overlying the relief image, but also imparts an optical dot gain due to internal reflections within the proof composite. When the adhesive layer thickness is lowered in an attempt to lower the optical dot gain, the lamination latitude and quality is diminished due to the entrapment of air between the image and the lamination of a succeeding color proofing element. This entrapment of air causes an undesirable image distortion in the final proof composite.

U.S. Pat. No. 4,889,787 discloses a positive acting color proofing system which incorporates a polyvinyl ether flexibilizer in the adhesive to improve lamination quality at lower adhesive thicknesses. Even though the lamination quality was improved, the lamination latitude of this system was narrow requiring careful control of the lamination conditions. U.S. Pat. No. 5,176,973 discloses a system where the adhesive layer of the first color proofing element laminated to the substrate is thicker and contains a white particulate, such as titanium dioxide. The white particulate decreases the halation effects of the thicker adhesive and thus lowers the dot gain. The thicker adhesive layer provides a cushion for subsequent laminations of color proofing elements having thinner adhesive layers. This cushioning effect assists in providing better contact during the lamination process which improves the lamination quality. The incorporation of the thicker adhesive layer improves both the lamination latitude and quality; however, the incorporation of the white particulate in the adhesive layer restricts the position of that particular color proofing element to the first position. Therefore, the choice of color sequence is limited. The position of the colored image in the composite effects the overall color rendition of the proof; therefore, it is desirable to have flexibility in choosing the color sequence to match the press. The desired background color of the composite proof also varies depending upon the type of print being simulated, for example a relatively white substrate for a commercial lithograph and a more yellow substrate for a newspaper. The incorporation of the white particulate shifts the underlying color of the paper substrate making it necessary to supply white particulate layers having different color characteristics; this is expensive and also requires an increased inventory of specialized colored materials.

There is a continuing need in the industry for a color proofing system which allows flexibility in choosing the color sequence and provides lower optical dot gains without sacrificing lamination latitude or quality. This need has become increasingly important with the technical advancement in printing presses which are capable of printing to much lower dot gains.

SUMMARY OF THE INVENTION

The present invention provides a single sheet color proofing element comprising, in the following order: (a) a releasable carrier; (b) a photosensitive color layer; (c) an optional barrier layer; and (d) a thermally activated colorless adhesive layer comprising a thermal adhesive having a glass transition temperature between 20° C. and 40° C. and selected from the group consisting of acrylates, methacrylates, vinyl acetates, and combinations thereof; wherein said adhesive layer has a thickness between 0.3 and 3.0 microns and preferably 0.5 to 2.5 microns. The photosensitive color layer may be either negative-acting or positive- acting.

In another embodiment of the present invention, a color proof composite is provided comprising a substrate having deposited thereon a plurality of halftone images having interposed there between a plurality of colorless adhesive layers comprising a thermal adhesive having a glass transition temperature between 20° C. and 40° C. and selected from the group consisting of acrylates, methacrylates, vinyl acetates, copolymers, and combinations thereof, wherein said adhesive layers have a thickness between 0.3 and 3.0 microns and said color proof composite has an optical dot gain between 10 and 22% (the lower value tending to occur with opaque receptor base, preferably between 15 and 22% on a transparent receptor base.

A multicolored image on a single receptor can be obtained by performing the following steps:

(i) laminating a first color proofing element with heat and pressure via the thermal adhesive layer to a developer resistant receptor;

(ii) removing the carrier sheet;

(iii) exposing the photosensitive color layer through a color separation corresponding to the color of the photosensitive color layer to actinic radiation to create a latent image;

(iv) developing the latent image with an aqueous alkaline developing medium to remove non-image areas of the photosensitive color layer and the barrier layer;

(v) laminating an additional color proofing element having a different colorant in the photosensitive color layer to the developed the first color proofing element;

(vii) repeating steps (v) and (ii)-(iv) in that order with additional color proofing elements as described above, each of the color proofing elements being of a different color or visual texture, to provide a multicolored image on a single substrate. The aforesaid color proofing element may be used for all of the laminable photosensitive elements used to make the multicolored proof composite. Alternatively, the aforesaid color proofing element may be used as the additional laminated photosensitive elements that are laminated over an image. Typically, one does not encounter a problem with lamination quality with the first lamination, since there is no relief image present.

It is recognized by one skilled in the art that other procedures can be used to obtain a multicolored image on a single substrate using the aforesaid photosensitive element in the processes described in U.S. Pat. Nos. 4,596,757; 4,650,738; 4,808,508; 4,929,532; 4,937,168; and EP 294, 665 and EP 403,128 patent applications.

DETAILED DESCRIPTION OF THE INVENTION

The present invention provides a photosensitive single sheet color proofing element comprising in order: a) a carrier having a release surface; b) a photosensitive color layer; c) an optional barrier layer; and d) a thermally activated adhesive having a Tg lower than 40° C., preferably lower than 35° C. and optical clarity. Preferably, it should be polar (for adhesion purposes).

The thickness of the adhesive layer is directly proportional to the optical dot gain observed in the final color proof composite. A lower adhesive thickness results in a lower optical gain. As printing presses become more efficient, the dot gain on the press is steadily decreasing thus creating a need for a proofing system that can accurately represent the lower dot gain curves.

A color proof composite is produced by first laminating a color proofing element to a receptor, imaging through a color separation and developing the latent image to produce a colored image on the receptor. Different colored images are then formed on top of the first colored image by repeating this sequence of steps with additional colors until the final color proof composite is produced. The first color is laminated directly to the relatively smooth surface of the substrate. Therefore, the primary considerations for adhesive choice is adequate adhesion to the substrate and resistance to the developing solution. The thickness of the adhesive layer in the first laminated color element can be lowered without having a significant impact on the performance of the adhesive. However, in subsequent laminations of different colors the adhesive is laminated over a relief image which may cause entrapment of air due to the uneven surface. This entrapment of air is sometimes referred to as microbubbles. Microbubbles decrease the density of the underlying colored images by scattering the incident light at the air/adhesive interface of the microbubble. When the adhesive coating weight is between 600 and 800 mg/ft$^2$, microbubbles are typically not present. However, when the adhesive coating weight is lowered to between 300 and 500 mg/ft$^2$, microbubbles increase to an unacceptable level.

In the present invention, these adhesives may be coated at coating weights between 50 and 200 mg/ft$^2$ with significantly lower levels of microbubbles. The lower adhesive coating weight lowers the overall dot gain observed in the composite color proof to between 10 and 22%. Analysis with a scanning electron microscope shows that the adhesive coating has collapsed into the non-image areas of the underlying relief image rather than bridging over the relief voids as seen in color composites having visible microbubbles.

As adhesive films are used over first down half-tone images, air can be entrapped between the dots on the first down image and the after applied adhesive film (e.g., with the next down image layer). The presence of the air as bubbles between the dots creates additional areas of reflection and refraction at air/film interfaces. The use of thin layers of adhesive with the properties according to the present invention has surprisingly been found to prevent or reduce formation of bubbles and thereby maintain the critical optical properties necessary in a proofing material.

The carrier sheet of the color proofing element is provided with a release surface which may either be a smooth surface of the carrier itself or a surface release layer thereon. The function of the release surface is to serve as a parting layer between the carrier sheet and the photosensitive color layer. The preferred material for use in the present invention is a 1.5 to 2.0 mil (3.7 to 5.6 cm) polyester film provided with a release layer comprising a cellulose methyl ether, polyvinylpyrolidone or polyvinyl alcohol resin. The release properties of the release layer may be adjusted by the addition of surfactants. Preferred surfactants include alkylarylpolyether alcohols, such as Triton™X-100 (octylphenoxy ethanol, available from Rohm & Haas, Philadelphia, PA), glycerin and ethoxylated castor oil. In the preferred embodiment, the surfactant is present in the release layer at about 0.1 to 5% by weight of solids in the layer, more preferably 0.5 to 2%. Other ingredients may be added such as mold inhibitors, anti-halation dyes, filter dyes, solvents, wetting agents, etc. Additionally, the carrier may have a smooth or textured surface and may also include colorants or UV absorbers.

A photosensitive color layer is coated onto the releasable surface of the carrier. The photosensitive color layer may be either a negative-acting photoinsolublizable or positive-acting photosolubilizable material. A negative- acting photoinsolublizable material may be based on a photosensitive polymeric diazonium salt or a photopolymerizable compound, which are well known in the art. Suitable polymeric diazonium salts include materials such as, the condensation product of p-diazodiphenylamine and formaldehyde (described in U.S. Pat. No. 2,714,066), and the condensation product of 3-methoxy4-diazo-diphenyl amine sulfate and 4,4'-bis-methoxy methyl diphenyl ether precipitated as a mesitylene sulfonate salt (described in U.S. Pat. No. 4,407,426). Suitable photopolymerizable compounds include materials, such as photopolymerizable polymers, oligomers or monomers containing multi-functional (meth) acrylates. Examples of photopolymerizable materials useful in color proofing applications are described in U.S. Pat. Nos. 5,248,583 and 4,482,625; and co-pending patent application Ser. No. 08/429,936 Elmasry titled "Aqueous Developable Color Proofing Elements," which uses a photopolymerizable oligomer based on an alkyl vinyl- or aryl vinyl-maleic anhydride partial-ester copolymer having a plurality of pendant ethylenically unsaturated groups.

The photosolubizable coatings used in positive-acting color proofing elements are typically based on naphthoquinone diazide compounds, which are also well known in the art. Suitable diazides include; the ester of t-butyl phenol and 6- diazo-5,6-dihydroxy-5-oxo-1-naphthalene sulfonic acid (available from St. Jean Photo Chemicals, Inc., St. Jean sur Richelieu, Ouebec); ester of 4-benzoyl-1,3- phenylene and 6-diazo-5,6-dihydroxy-5-oxo-1-naphthalene sulfonic acid (available from St. Jean Photo Chemicals, Inc.); and the ester of bis-(3-benzoyl-4,5,6- trihydroxyphenyl)methane and 2-diazo-1-naphthol-4-sulfonic acid or 2-diazo-1-naphthol-5-sulfonic acid (described in U.S. Pat. No. 4,407,926).

The photosensitive color layer may also include non-acidic materials to adjust the developability of the layer depending upon the strength of the developer. It is sometimes advantageous to increase the strength of the developer slightly to formulate a more robust film. This will provide more latitude when the proofing elements are subjected to the mechanical action of brushes or developing pads in an automated processing apparatus. The preferred materials in a negative-acting system for adjusting developability include photopolymerizable compounds having a plurality of pendant ethylenically unsaturated polymerizable groups, such as photopolymerizable polymers, oligomers or monomers having a weight average molecular weight of about 400 to 1,500 and at least 2 pendant ethylenically unsaturated polymerizable groups, more preferably at least 4 pendant ethylenically unsaturated polymerizable groups. Examples of suitable ethylenically unsaturated polymerizable groups include acryloyl, methacryloyl and acrylamido groups. Suitable polymers, oligomers or monomers are well known in the art and non- exclusively include materials such as novolac acrylate resins (i.e., Echo™310, available from Echo Resins and Laboratory, Versailles, MO), acrylate or methacrylate esters of polyols, (i.e., polybutane diol diacrylate, dipentaerythritol pentaacrylate, pentaerythritol tetraacrylate and triacrylate, pentaerythritol tetramethacrylate and trimethacrylate, hydantoin hexaacrylate, and tetrahydrofurfurylmethacrylate), acrylated or methacrylated urethane oligomers (i.e., Ebecryl™220, hexaacrylate urethane oligomer, available from UCB Radcure Inc., Louisville, KY), and acrylamides (i.e., diacetone acrylamide and acrylamidoethyl methacrylate). The composition of the polymer, oligomer or monomer backbone is not critical as long as it does not impart visible color shifts (less than 1 delta E measured spectrophotometrically with a Gretag SPM spectrophotometer) in the photosensitive color layer during the imaging process or upon natural aging (90 days at ambient temperature).

A balance is maintained between the acid functionality, the polymerizable functionality and the strength of the developing medium to optimize the resolution and latitude of the final imaged proofing element. The best resolution is achieved when an aqueous developer is used having a pH of about 10 to 11, preferably 10 to 10.5 and the acid number of the photosensitive layer is adjusted to about 30 to 75, more preferred 40 to 60 and most preferred 45 to 55. The preferred weight percentage of polymerizable materials present in a negative-acing photosensitive layer is 20 to 80% and most preferred is 40 to 60%.

In the preferred embodiment, the photoinitiator(s) used in a negative-acting system must not generate a visible color change in the image or adhesive layers after exposure. Examples of photoinitiators non-exclusively include; triazines, acetophenones, benzophenones, and thioxanthones. The preferred photoinitiators include Irgacure™907 (2-methyl-1-(4-(methylthio)phenyl)-2-(4-morpholinyl)-1-propane) available from Ciba Geigy Corp., Hawthorne, NY), Irgacure™369 (2- benzyl-2-(dimethylamine)- 1 4-(4-morpholinylphenyl)- 1 -butanone, available from Ciba Geigy Corp., Hawthorne, NY), Speedcure™ITX (isopropylthioxanthone, available from Aceto Chemical Co. Inc., Flushing, NY) and triazines tethered to alkylarylpolyether alcohols as described in U.S. Pat. No. 5,298,361. The initiators may be used singly or in combination with each other. The optimum amount of initiator will be dependent upon the oligomer type used and the filtering effect of the pigment used; however, the initiator is usually present in concentrations of about 1.0–15% by weight of the negative-acting photosensitive composition. Since the positive-acting systems are based on photosolublization and are formulated with photosensitive diazides, there is no need to add a photoinitiator or photosensitizer to a positive-acting system.

Pigments or dyes may be used as colorants in the photosensitive color layer. However, pigments or polymeric dyes are preferred since they have a lower tendency for migration between the layers. Pigments are more preferred due to the wide variety of colors available and lower cost. Pigments are generally introduced into the photosensitive formulation in the form of a millbase comprising the pigment dispersed with a binder and suspended into a solvent or mixture of solvents. The dispersion process may be accomplished by a variety of methods well known in the art, such as two-roll milling, three-roll milling, sand milling, ball milling, etc. Many different pigments are available and are well known in the art. The pigment type and color are chosen such that the coated color proofing element is matched to a preset color target or specification set by the industry. Color enhancing additives may be used which include fluorescent, pearlescent, iridescent, and metallic materials. Materials such as silica, polymeric beads, reflective and non- reflective glass beads, or mica may also be added in place of a colorant to provide a textured image. The color enhancing additives or texturing materials may be used either alone or in combination with the above pigments to produce proofs with the desired visual effects.

The type of dispersing resin and the pigment to resin composition ratio chosen are dependent upon the pigment type, surface treatment on the pigment, dispersing solvent and milling process. Some examples of resins suitable for generating millbases which are compatible with the aforementioned photosolubilizable and photoinsolubilizable materials include; polyvinyl acetate/crotonic acid copolymers, styrenemaleic anhydride partial-ester resins, acid containing acrylic and methacrylic polymers and copolymers, polyvinyl acetals, polyvinyl acetals modified with anhydrides and amines, hydroxy alkyl cellulose resins and styrene/acrylic/acrylic acid resins. The dispersion may contain a mixture of these resins. The pigment to resin ratio in the dispersion is typically between 0.6 to 5.0, preferably between 0.8 to 3.0.

A dispersing agent may be necessary to achieve optimum dispersion quality. Some examples of dispersing agents include; polyester/polyamine copolymers, alkylarylpolyether alcohols, acrylic resins and Disperbyk™ wetting agents available from Byk-Chemie USA, Wallingford, CT. Other components may also be included in the millbase such as surfactants to improve solution stability, fluorescent materials, optical brighteners, UV absorbers, fillers, etc.

The preferred composition of the millbase solids comprises about 30–71% by weight pigment, 15–30% by weight acidic resin, 0–25% non-acidic resin, and 0–20%, more preferably 0–10% by weight dispersing agents. Additional binders may also be included in the photosensitive color formulation to balance developability and tack for each color. The coating weights of the individual colors may vary in order to achieve the preset color target. The color formulations are adjusted to achieve optimum color, resolution, exposure speed and developability. Typical dry color coating weights are between 50 mg/ft$^2$ and 150 mg/ft$^2$ (0.54 g/m$^2$ and 1.61 g/m$^2$), preferred 60 mg/ft$^2$ and 90 mg/ft$^2$ (0.65 g/m$^2$ and 0.97 g/m$^2$).

Coated adjacent to the photosensitive color layer is an optional photopolymerizable or photosolubilizable barrier layer depending upon whether the color proofing sytem is negative-acting or positive-acting. The barrier layer is present to prevent interaction between the color layer and the adhesive, and also improves developability of the non-image areas. In a positive-acting system the barrier layer is typically the same as the photosolubilizable color layer without the colorant. In a negative-acting system the barrier layer typically comprises an photopolymerizable ethylenically unsaturated compound, an acidic binder and a photoinitiator. Preferred examples of ethylenically unsaturated compounds include acrylated epoxy oligomers, acrylated urethane oligomers as described in U.S. Pat. No. 4,304,923, Echo™ TAE 310 (triacrylated aromatic epoxide available from Echo Resins and Laboratory, Versailles, MO) and Dynacoll™ A6083 (acrylated copolyester available from Huls America, Piscataway, NJ). The ethylenically unsaturated compound is present at about 50–65% by weight of the total barrier composition. Preferred binders include; polyvinyl acetate/crotonic acid copolymers, styrene/maleic anhydride partial-ester resins, acid containing acrylic and methacrylic polymers and copolymers, acidified polyvinyl acetals, and styrene/acrylic/acrylic acid resins. The acidic binder or resin is present at about 30- 50% by weight of the total barrier composition. Preferred photoinitiators include; Irgacure™907, Speedcure™ITX and triazines tethered to alkylarylpolyether alcohols. The initiator is present at 0–10% by weight of the total barrier composition. The addition of photoinitiator may be unnecessary depending upon the extent upon which the barrier layer intermixes with the adjacent photosensitive color layer. The barrier layer is coated to a dry coating weight of about 0.15 to 2.0 g/m$^2$, preferably about 0.2 to 1.0 g/m$^2$.

Coated adjacent to the photopolymerizable barrier layer is the adhesive layer. The adhesive layer provides a means of laminating the color proofing element to a temporary or permanent substrate under heat and pressure. The solvent used for this coating is choosen such that the coating solution does not attack or interact with the coatings present on the carrier. Examples of solvents include alcohols, water and hydrocarbon solvents. Because hydrocarbon solvents like heptane and naphtha are prone to irregular coating patterns, due primarily to static, more polar solvents such as water and alcohols are preferred. In contrast with the softening characteristics of the adhesive, it is desirable that the adhesive not block during storage or shipment. Resins having a Tg between 20° C. and 40° C., including copolymers and terpolymers of alkyl acrylate, alkyl methacrylate, styryl, and acrylamide monomers, meet both the lamination criteria and avoid the potential for blocking, without requiring the use of an additional protective liner. Useful resins include polymers, copolymers and terpolymers of methyl methacrylate, n- butyl methacrylate, n-butyl/isobutyl methacrylate, vinylacetates, N-(hydroxymethyl) acrylamide and styrenes. Polyester polyurethanes (i.e., Cydrothane™HP-5035 Polyurethane Dispersion available from Cytec Industries Inc.) have been shown to entrap air even at the lower coating thicknesses. It is speculated that these materials are better gas barriers than the acrylic materials, thus not allowing gas to escape from the microbubble. Preferred materials include Reichhold latex adhesives #40440 (methylmethacrylate/ butylacrylate copolymer having a Tg of 22° C.) and #97603 (acrylic polymer having a Tg of 36° C.) available from Reichhold Co., Dover, DE. Other additives may be present to aid in coating and performance such as surfactants, coalescent aids, plasticizers, slip agents (i.e., polymethacrylate beads like those described in U.S. Pat. No. 4,885,225, silica, polyethylene waxes), optical brighteners, UV absorbers, etc.

A multicolored proof is made by laminating a color proofing element onto a receptor. The carrier may be removed either prior to exposure or prior to the development step. The laminated structure is imaged through a color separation graphic art film corresponding to the color of the proofing element to create a latent image. The spectral and power output of the exposure unit and the absorption of the photosensitized system are chosen for an optimum exposure speed. Typical exposure units are equipped with UV lamps having optimum spectral outputs between 250 nm and 500 nm and a power output between 2.5 and 10 Kilowatts. The exposed laminated structure is then developed with an aqueous alkali developer. The process of laminating, exposing and developing is then repeated using a different color until the desired multicolored composite proof is complete. A non-colored or textured image may be added if so desired by laminating, exposing and developing a proofing element whose photosensitive layer contains texturing materials such as those described earlier in place of or in addition to a colorant.

The receptor may be a permanent substrate. A suitable composition for the receptor sheet is a heat stable, waterproof white paper, such as P-350 (available from Schoeller Technical Paper Sales, Inc. of Pulaski, N.Y.) or Matchprint™base (available from 3M, St. Paul, Minn.). The receptor sheet may also be a polyester film or any other heat stable plastic material. Alternatively, the receptor may be a temporary receptor such as those described in U.S. Pat. Nos. 5,240,810; 5,192,630; and 5,094,931.

Developer solutions used to develop the image after exposure are typically comprised of a combination of Sodium or Potassium carbonate, and Sodium or Potassium bicarbonate and a surfactant. In the preferred embodiment, the carbonate is present at about 0.5–2.0% by weight, the bicarbonate is present at about 0–1.0% by weight, and the surfactant is present at about 0.1–1.0% by weight of the total aqueous developer solution. The preferred surfactants non-exclusively include; Surfynol™465 (ethoxylated tetramethyl decynediol, available from Air Products and Chemicals, Allentown, PA), Surfactol™365 (ethoxylated castor oil, available from CasChem Inc., Bayonne, NJ), Triton™X-100 (octylphenoxypolyethoxyethanol, available from Rohm and Haas, Philadelphia, PA), and Surfynol™GA (acetylenic diols compounded with other non-ionic surfactants and solvents, available from Air Products and Chemicals, Allentown, PA).

The invention will now be illustrated in the following non-limiting examples:

EXAMPLES

Unless designated otherwise, all materials are available from Aldrich Chemicals, Milwaukee, Wis.

Preparations

The following preparations describe methods for preparing materials used in the examples that are not commercially available.

Preparation of Acidified Butvar™ B-98

A 2 liter 3-necked roundbottom flask equipped with an overhead stirrer was charged with 300 g of Butvar™B-98 (available from Monsanto Co., St. Louis, MO), 90 g of succinic anhydride, 90 g of triethylamine and 900 g of methyl ethyl ketone. The mixture was heated at 77° C. for six hours. The solvent was removed under vacuum yielding a white solid. An Infrared spectrum of the material showed no anhydride peaks.

Preparation of Tethered m-MOST-ol photoinitiator

A stirred solution of 103 g of 2,4-bis(trichloromethyl)-1, 3,5-triazine, 47 g of 3-(2-hydroxyethoxy)benzaldehyde), and 10.5 g of ammonium acetate in 270 mL of methanol was refluxed for 12 hours. After the mixture had cooled, an additional 80 mL of methanol was added, followed by 112 mL of water. The resultant precipitate was filtered and dried to yield 74 g of 2,4-bis(trichloromethyl)-6-[3-(2-hydroxy) styryl]-1,3,5-triazine (herein after refered to as To a stirred dispersion containing 55.00 g of m-MOST-ol and 18.2 g of 2,4-tolylene diisocyanate (herein after refered to as "TDI") in 200 mL of toluene at 16° C. was added 0.150 g of dibutyltin dilaurate. A slight exotherm raised the temperature of the reaction mixture to 19° C. and the reaction mixture became clear after approximately 20 minutes. The m-MOST-ol had completely reacted in 5 hours and the resulting mixture of m-MOST-ol/TDI, (m-MOST-ol)$_2$/TDI and residual 2,4-tolylene diisocyanate. To this mixture was added 58.92 g of a 79.2% solution of polyoxyethylene nonylphenol (Igepal™CO-520) in toluene and the solution was heated to 60° C. and maintained at that temperature for 4 hours. Removal of the toluene under vacuum by means of a rotary evaporator provided a slightly brown viscous syrup. The material was redissolved in sufficient methyl ethyl ketone to produce a solution having a concentration of approximately 50% total solids.

Acrylated Urethane Oligomer P-11 (as described in U.S. Pat. No. 4,304,923)

Polycaprolactone hexol was prepared by adding 63.5 g dipentaerythritol, 228 g of epsilon-caprolactone, and 0.02 g of 2,6-di-t-butyl-4-methylphenol to a 500 mL, three-neck flask equipped with an overhead mechanical stirrer and a condenser. The liquid was deoxygenated for 20 minutes by bubbling with dry nitrogen from a gas dispersion tub. This tube was then replaced with a gas inlet adapter and the reaction mixture heated while maintaining a slight positive pressure with nitrogen. The mixture was maintained at 170° C. for 5 hours under continual stirring. The reaction mixture was then allowed to cool to room temperature under nitrogen atmosphere.

A 1 liter three-neck flask was fitted with an adapter, mechanical stirrer, thermometer, addition funnel and drying tube. To this flask was charged 175 g of the polycaprolactone hexol and 60 mL of methyl ethyl ketone. A solution of 13 g of 2.4-tolylene diisocyanate in 9 mL of methyl ethyl ketone was slowly dripped into the first solution with stirring at room temperature. The addition was completed in 20 minutes and the reaction mixture stirred for 90 minutes at 30° C.

To a second flask fitted with an overhead mechanical stirrer, thermometer, addition funnel and drying tube was charged 86.1 g of 2,4-tolylene diisocyanate. Through the addition funnel was added 70.2 g of 2-hydroxyethylmethacrylate (herein after refered to as "HEMA") and 0.02 g of 2,6-di-t-butyl-4-methylphenol (herein after refered to as "inhibitor") slowly with stirring to the diisocyanate while maintained below or at 30° C. The addition was completed in 15 minutes and after 40 minutes of reaction time, a white solid formed. The solid was dissolved in 45 mL of methyl ethyl ketone by heating to 45° C. and held at that temperature for 10 minutes to complete the reaction.

The flask containing the reaction product of the polycaprolactone hexol and the 2,4-tolylene diisocyanate was heated to 67° C. and the solution of the HEMA/2,4-tolylene diisocyanate adduct in methyl ethyl ketone was added slowly with stirring over a period of 2 hours. 27 g of succinic anhydride was then added with an additional 0.02 g of the inhibitor. Heating and stirring was continued until the anhydride had completely reacted (about 5-6 hours).

Standard Millbases and Coating Solutions

The following standard millbases and coating solutions were used in the Examples.

| Release Layer Coating Solution: | |
|---|---|
| Airvol ™ 205 Polyvinyl alcohol (available from Air Products and Chemicals, Allentown, PA) | 5.6 g |
| Airvol ™ 107 Polyvinyl alcohol (available from Air Products and Chemicals, Allentown, PA) | 2.4 g |
| Triton ™ X-100 (octylphenoxypolyethoxyethanol, available from Rohm and Haas, Philadelphia, PA) | 0.2 g |
| Kathon ™ CG/ICP Preservative (available from Rohm and Haas, Philadelphia, PA) | 0.09 g |
| Deionized Water | 91.7 g |

| | Millbases: | | | | |
|---|---|---|---|---|---|
| Ingredients | Red Shade Magenta | Blue Shade Magenta | Black | Green Shade Cyan | Red Shade Cyan |
| Sun 234-0077 Red Shade Magenta (available from Sun Chemical, Cincinnati, OH) | 8.4 g | | | | |
| C-G RT-333D Blue Shade Magenta (available from Ciba-Geigy, Newport, DE) | | 8.47 g | | | |
| Raven 760 (available from Columbian Chemicals Co., Tulsa, OK) | | | 8.3 g | | |
| Sun 249-0592 Green Shade Cyan (available from Sun Chemical, Cincinnati, OH) | | | | 8.72 g | |
| Sun 248-0615 Red Shade Cyan (available from Sun Chemical, Cincinnati, OH) | | | | | 8.72 g |
| Acidified Butvar ™ B-98 | 1.12 g | 2.82 g | 1.483 g | 2.9 g | 2.9 g |
| Joncryl ™ 67 (styrene/acrylic resin available from S.C. Johnson Wax, Racine, WI) | 4.48 g | 2.82 g | 4.43 g | 2.9 g | 2.9 g |
| Disperbyk ™ 161 (available from Byk-Chemie USA, Wallingford, CT) | 0.84 g | 0.85 g | 0.75 g | 0.436 g | 0.436 g |
| FC-430 (fluorchemical surfactant, available from 3M, St. Paul, MN) | 0.168 g | 0.0045 g | 0.033 g | 0.03 g | 0.03 g |
| Methyl ethyl ketone | 59.5 g | 59.5 g | 59.5 g | 59.5 g | 59.5 g |
| Propyleneglycol monomethyl ether | 25.5 g | 25.5 g | 25.5 g | 25.5 g | 25.5 g |

| Photopolymerizable Barrier Layer Coating Solution | |
|---|---|
| Echo ™ 310 (novolac diacrylate resin, available from Echo Resins and Laboratory, Versailles, MO) | 2.9 g |
| Joncryl ™ 586 (styrene/acrylic resin, available from S.C. Johnson Wax, Racine, WI) | 2.0 g |
| Tethered m-MOST-ol photoinitiator | 0.1 g |
| Methyl ethyl ketone | 95.0 g |

Example 1

Two sets of four separate cyan, magenta, yellow and black single sheet color proofing elements were prepared by first coating and drying a release layer onto a 2 mil (0.051 mm) polyester substrate to achieve a dry coating weight of about 1 g/m$^2$. The corresponding photosensitive color layer solution was then coated and dried onto the release layer at a target density measured with a Gretag SPM-100 spectrophotometer. (Cyan=1.40; Magenta=1.50; Yellow=1.04; and Black=1.80) The photopolymerizable barrier solution was then applied at a dry coating weight of approximately 32 mg/ft$^2$ (0.34 g/m$^2$).

Each of the colored elements were then overcoated at two different dry coating weights (200 mg/ft$^2$ and 100 mg/ft$^2$) with the following adhesive coating solution diluted to 10% with water and coated with in-line mixing of 6 micron polymethylmethacrylate beads (prepared as described in U.S. Pat. No. 2,701,245):

| | |
|---|---|
| #40440 acrylic adhesive (methyl methacrylate and butylacrylate copolymer, available from Reichhold Co., Dover, DE) | 1,838 g |
| Deionized Water | 1,559 g |
| Surfynol ™ SE-F (available from Air Products) | 3.4 g |

A four color proof was made by first laminating the cyan color proofing element onto a Matchprint™Commercial Color Proofing Base (available from 3M, St. Paul, MN). The polyester carrier was removed, the laminated film was then exposed with a UV light source having a power output of 0.15 Watt/cm$^2$ through a cyan separation negative. The imaged film was then developed using a developer comprising 1% potassium carbonate, 1% potassium bicarbonate and 0.1% Surfynol™465 (ethoxylated tetramethyldecynediol surfactant, available from Air Products) in water. The other three colors were then laminated, exposed and developed in the same manner using the appropriate color separation films.

Example 2

The following example illustrates the improvement in lamination latitude. Three different sets of films were used in comparing the lamination latitude of commercially available materials at higher coating weights with the low gain color proofing elements described in Example 1. Matchprint™ Publication SWOP negative color proofing films (adhesive coating thickness of 7 microns) and Matchprint™ Commercial negative color proofing films (adhesive coating thickness of 5 microns) both available from 3M, St. Paul, MN were used in the comparative analysis. The lamination latitude of each of the films was evaluated on a Matchprint™ 1147 laminator (available from 3M, St. Paul, MN). The conditions were based on a two factor three level response surface design. The upper roll temperature was varied between 220° F. and 250° F., and the bandwidth varied between 5.5 mm and 7.0 mm. The laminated films were evaluated for dimensional stability in four directions along with microbubbles. A full-quadratic model was fit to the responses observed. All three films behaved similarly with respect to dimensional stability. However, the color proofing elements from Example 1 showed a much improved response for microbubbles than the commercially available materials. The estimated coefficients for the microbubble response at the minimum lamination condition (220° F. upper roll temperature and 5.5 mm bandwidth) were −20.8 for the Publication SWOP films; −16.5 for the Commercial films; and −3.3 for Example 1 color proofing elements.

What is claimed:

1. A color proof composite comprising a substrate having deposited thereon a plurality of halftone images having interposed there between a plurality of colorless adhesive layers comprising a thermal adhesive having a glass transition temperature between 20° C. and 40° C., wherein said adhesive layers have a thickness between 0.5 and 3.0 microns and said color proof composite has an optical dot gain between 10 and 22%.

2. The color proof composite of claim 1 wherein said thermal adhesive has a glass transition temperature between 20° C. and 35° C.

3. The color proof composite of claim 1 wherein said thermal adhesive is selected from the group consisting of acrylates, methacrylates, vinyl acetates, and combinations thereof.

4. The color proof composite of claim 1 wherein said thermal adhesive is a copolymer of methylmethacrylate and butylacrylate.

5. The color proof composite of claim 1 wherein said thermal adhesive is an acrylic polymer.

6. The color proof composite of claim 1 wherein said adhesive layers have a thickness between 0.5 and 2.5 microns.

7. A color proof composite comprising a substrate having deposited thereon a plurality of halftone images having interposed there between a plurality of colorless adhesive layers comprising a thermal adhesive selected from the group consisting of acrylates, methacrylates, vinyl acetates, and combinations thereof having a glass transition temperature between 20° C. and 40° C., wherein said adhesive layers have a thickness between 0.5 and 2.5 microns and said color proof composite has an optical dot gain between 10 and 22%.

8. The color proof composite of claim 10 wherein said thermal adhesive is coated as a latex adhesive.

* * * * *

UNITED STATES PATENT AND TRADEMARK OFFICE
CERTIFICATE OF CORRECTION

PATENT NO.: 5,763,122
DATED: June 9, 1998
INVENTOR(S): Weeks

It is certified that error appears in the above-identified patent and that said Letters Patent is hereby corrected as shown below:

Col. 10, line 33, "(herein after refered to as" should be --(herein after refered to as "m-MOST-ol").--

Signed and Sealed this

Second Day of February, 1999

Attest:

Attesting Officer

*Acting Commissioner of Patents and Trademarks*